(12) United States Patent
Cheng et al.

(10) Patent No.: US 9,059,232 B2
(45) Date of Patent: Jun. 16, 2015

(54) T-SHAPED COMPOUND SEMICONDUCTOR LATERAL BIPOLAR TRANSISTOR ON SEMICONDUCTOR-ON-INSULATOR

(71) Applicant: International Business Machines Corporation, Armonk, NY (US)

(72) Inventors: Cheng-Wei Cheng, White Plains, NY (US); Tak H. Ning, Yorktown Heights, NY (US); Ghavam G. Shahidi, Round Ridge, NY (US); Kuen-Ting Shiu, White Plains, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 71 days.

(21) Appl. No.: 14/020,260

(22) Filed: Sep. 6, 2013

(65) Prior Publication Data

US 2014/0370683 A1    Dec. 18, 2014

Related U.S. Application Data

(63) Continuation of application No. 13/917,104, filed on Jun. 13, 2013.

(51) Int. Cl.
*H01L 29/66* (2006.01)
*H01L 29/737* (2006.01)
(Continued)

(52) U.S. Cl.
CPC ........ *H01L 29/737* (2013.01); *H01L 29/66242* (2013.01); *H01L 29/1004* (2013.01);
(Continued)

(58) Field of Classification Search
CPC .............. H01L 29/1004; H01L 27/082; H01L 29/0808; H01L 29/1008; H01L 29/66242; H01L 29/6625; H01L 29/73
See application file for complete search history.

(56) References Cited

U.S. PATENT DOCUMENTS

| 7,288,829 | B2 | 10/2007 | Khater et al. |
| 7,368,764 | B1 | 5/2008 | Thomas, III et al. |

(Continued)

OTHER PUBLICATIONS

Cai, J. et al., "Complementary Thin-Base Symmetric Lateral Bipolar Transistors on SOI", Electron Devices Meeting (IEDM), Date of Conference: Dec. 5-7, 2011, 2011 IEEE International, pp. 16.3.1-16.3.4, Conference Location: Washington, DC.

(Continued)

*Primary Examiner* — Benjamin Sandvik
*Assistant Examiner* — Leslie Pilar Cruz
(74) *Attorney, Agent, or Firm* — Scully, Scott, Murphy & Presser, P.C.; Louis J. Percello, Esq.

(57) ABSTRACT

A base region extends upward from a recessed semiconductor surface of a semiconductor material portion present on an insulator. The base region includes a vertical stack of, an extrinsic base region and an intrinsic base region. The extrinsic base region includes a first compound semiconductor material portion of a first conductivity type and a first dopant concentration. The intrinsic base region includes another first compound semiconductor material portion of the first conductivity type and a second dopant concentration which is less than the first dopant concentration. A collector region including a second compound semiconductor material portion of a second conductivity type opposite of the first conductivity type is located on one side on the base region. An emitter region including another second compound semiconductor material portion of the second conductivity type is located on another side on the base region.

9 Claims, 5 Drawing Sheets

(51) Int. Cl.
*H01L 29/73* (2006.01)
*H01L 29/10* (2006.01)

(52) U.S. Cl.
CPC ......... *H01L29/1008* (2013.01); *H01L 29/6625* (2013.01); *H01L 29/66265* (2013.01); *H01L 29/7317* (2013.01)

(56) References Cited

U.S. PATENT DOCUMENTS

| | | | |
|---|---|---|---|
| 7,538,004 B2 | 5/2009 | Geiss et al. | |
| 7,615,457 B2 | 11/2009 | Akatsu et al. | |
| 7,923,754 B2 | 4/2011 | Miyamoto et al. | |
| 7,932,541 B2 | 4/2011 | Joseph et al. | |
| 2008/0227262 A1 | 9/2008 | El-Kareh et al. | |
| 2011/0266630 A1* | 11/2011 | Suligoj et al. | 257/370 |
| 2012/0249009 A1 | 10/2012 | Walter et al. | |
| 2014/0027871 A1 | 1/2014 | Cai et al. | |
| 2014/0030838 A1* | 1/2014 | Cai et al. | 438/49 |

OTHER PUBLICATIONS

U.S. Notice of Allowance dated Feb. 17, 2015 received in related U.S. Appl. No. 13/917,104.

* cited by examiner

T-SHAPED COMPOUND SEMICONDUCTOR LATERAL BIPOLAR TRANSISTOR ON SEMICONDUCTOR-ON-INSULATOR

CROSS REFERENCE TO RELATED APPLICATION

This application is a continuation of U.S. patent application Ser. No. 13/917,104, filed Jun. 13, 2013 the entire content and disclosure of which is incorporated herein by reference.

BACKGROUND

The present application relates to a semiconductor structure and a method of forming the same. More particularly, the present application relates to a compound semiconductor lateral bipolar transistor and a method of forming the same.

Bipolar junction transistors are typically found in demanding types of analog circuits, especially analog circuits used in high-frequency applications. For example, bipolar junction transistors can be found in radio frequency integrated circuits (RFICs) used in wireless communications systems, as well as integrated circuits requiring high power efficiency, such as power amplifiers in cellular telephones, and other types of high speed integrated circuits. Bipolar junction transistors may be combined with complementary metal-oxide-semiconductor (CMOS) field effect transistors in bipolar complementary metal-oxide-semiconductor (BiCMOS) integrated circuits, which take advantage of the favorable characteristics of both transistor types.

Conventional bipolar junction transistors such a vertical bipolar transistor, include three semiconductor regions, namely the emitter, base, and collector regions. Generally, a bipolar junction transistor includes a pair of p-n junctions, namely an emitter-base junction and a collector-base junction. A heterojunction bipolar transistor (HBT) is a variety of bipolar junction transistor that employs at least two semiconductor materials with unequal band gaps for the emitter/collector and base regions, creating a heterojunction.

While conventional vertical bipolar transistors still outperform existing complementary metal oxide semiconductor (CMOS) transistors in many analog and mixed signal applications, conventional vertical bipolar transistors are not suitable for use in digital applications because of the large footprint and high supply voltage ($V_{DD}$)/high power consumption in a current-switch logic circuit. The collector-base junction area ($A_{BC}$) of conventional vertical bipolar transistors is typically more than 3× larger than the emitter-base area, and the collector region is more lightly doped than the base region. Attempts to increase the doping level in the collector region ($N_C$) to a level comparable with the doping level in the base region ($N_B$) will result in a large increase in collector-base capacitance. This large and relatively lightly doped collector region causes vertical bipolar circuits to slow down dramatically if $V_{DD}$ is scaled below 1 V due to the saturation effect when the collector-base junction is forward biased and a large amount of minority carriers are stored on the collector region. The lightly doped collector region also limits the high-frequency performance at high current densities due to base-push-out effect.

With the advent of semiconductor-on-insulator (SOI) technology, innovative thin-base lateral bipolar transistors containing an asymmetrical emitter/collector region without $A_{BC}$ penalty have been developed. The asymmetrical emitter/collector design of such thin-base lateral bipolar transistors still makes them vulnerable to base-push-out effect. Moreover, thin-base lateral bipolar transistors containing an asymmetrical emitter/collector region are not suitable for operation in a saturation region. Furthermore, there are density/process cost issues that are associated with forming thin-base lateral bipolar transistors containing an asymmetrical emitter/collector region.

SUMMARY

A thin-base compound semiconductor lateral bipolar transistor having a symmetrical emitter-base junction and a symmetrical collector-base junction and a method of forming the same are provided. In some cases, in which the compound semiconductor material used in providing the base region is a different compound semiconductor material used in providing the collector and emitter regions, a thin-base compound semiconductor lateral heterojunction bipolar transistor can be provided. The thin-base compound semiconductor lateral bipolar transistor of the present application is electrically similar to a Si-containing emitter-collector symmetrical lateral bipolar transistor on insulator. The extrinsic base and intrinsic base of the thin-base compound semiconductor lateral bipolar transistor of the present application are grown using a high-aspect ratio selective growth on semiconductor material process. Such processing provides a T-shape device structure, with the extrinsic base located beneath, instead of above, the intrinsic base region.

In one aspect of the present application, a semiconductor structure, i.e., a lateral bipolar transistor on a semiconductor-on-insulator, is provided. In some cases, the lateral bipolar transistor can be a lateral heterojunction bipolar transistor. The semiconductor structure of the present application includes at least one semiconductor material portion located on a surface of a buried insulator layer. The structure further includes a base region extending upward from a recessed semiconductor surface of the at least one semiconductor material portion, wherein the base region comprises a vertical stack of, from bottom to top, an extrinsic base region and an intrinsic base region. The extrinsic base region comprises a first compound semiconductor material portion of a first conductivity type and a first dopant concentration and the intrinsic base region comprises another first compound semiconductor material portion of the first conductivity type and a second dopant concentration, wherein the second dopant concentration is less than the first dopant concentration. The structure even further includes a collector region comprising a second compound semiconductor material portion of a second conductivity type which is opposite of the first conductivity type located on one side on the base region and in direct contact with a sidewall surface of the intrinsic base region. The structure yet further includes an emitter region comprising another second compound semiconductor material portion of the second conductivity type which is opposite of the first conductivity type located on another side on the base region and in direct contact with another sidewall surface of the intrinsic base region.

In another aspect of the present application, a method of forming a semiconductor structure, i.e., a lateral bipolar transistor on a semiconductor-on insulator, is provided. The method includes providing a structure including at least one semiconductor material portion laterally surrounded by an isolation structure and located on a surface of a buried insulator layer, wherein a layer of oxide is located on exposed surface of each of the at least one semiconductor material portion and the isolation structure. A trench is then formed through the layer of oxide and partially into the at least one semiconductor material portion, wherein the trench provides a recessed semiconductor surface within the at least one semiconductor material portion. Next, a dielectric spacer is formed on exposed sidewall surfaces of the at least one semiconductor material portion within the trench. A first semiconductor compound material is then epitaxially grown from the recessed semiconductor surface. The first semiconductor compound material comprises a bottommost compound semiconductor material portion of a first conductivity type and a first dopant concentration, and a topmost compound semiconductor material portion of the first conductivity type and a second dopant concentration, wherein the second dopant concentration is less than the first dopant concentration. Next, a first recessed opening is formed in the layer of oxide to expose one sidewall surface of the topmost compound semiconductor material portion and a second recessed opening is formed in the layer of oxide to expose another sidewall surface of the topmost compound semiconductor material portion. A second compound semiconductor material portion of a second conductivity type that is opposite from the first conductivity type is then formed within each of the first and second recessed openings. Next, an insulator layer is formed atop exposed surfaces of each of the second compound semiconductor material portions and the topmost semiconductor material portion.

DETAILED DESCRIPTION

Figure 1:
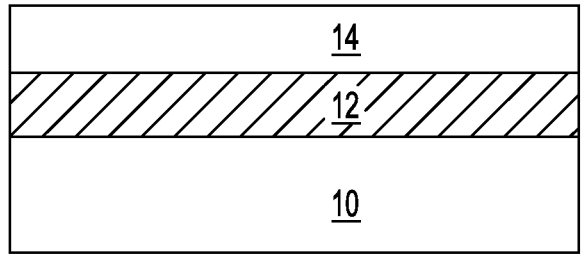
FIG. 1 is a pictorial representation (through a cross sectional view) illustrating a semiconductor-on-insulator substrate that can be employed in one embodiment of the present application.

The present application, which provides a T-shaped compound semiconductor lateral bipolar transistor and a method of forming the same, will now be described in greater detail by referring to the following discussion and drawings that accompany the present application. It is noted that the drawings of the present application are provided for illustrative purposes and, as such, they are not drawn to scale. In the drawings and the description that follows, like elements are referred to by like reference numerals. For purposes of the description hereinafter, the terms "upper", "lower", "right", "left", "vertical", "horizontal", "top", "bottom", and derivatives thereof shall relate to the components, layers and/or elements as oriented in the drawing figures which accompany the present application.

In the following description, numerous specific details are set forth, such as particular structures, components, materials, dimensions, processing steps and techniques, in order to provide a thorough understanding of the present application. However, it will be appreciated by one of ordinary skill in the art that the present application may be practiced with viable alternative process options without these specific details. In other instances, well-known structures or processing steps have not been described in detail in order to avoid obscuring the various embodiments of the present application.

As stated previously, the present application provides a thin-base compound semiconductor lateral bipolar transistor having a symmetrical emitter-base junction and a symmetrical collector-base junction and a method of forming the same. These aspects of the present application are now described in greater detail.

Reference is now made to FIG. 1, which illustrates a semiconductor-on-insulator (SOI) substrate that can be employed in one embodiment of the present application. The SOI substrate comprises a vertical material stack of, from bottom to top, a handle substrate 10, a buried insulator layer 12 and a topmost semiconductor layer 14.

In some embodiments of the present application, the handle substrate 10 and the topmost semiconductor layer 14 of the SOI substrate may comprise a same, or different, semiconductor material. The term "semiconductor" as used herein in connection with the semiconductor material of the handle substrate 10 and the topmost semiconductor layer 14 denotes any semiconducting material including, for example, Si, Ge, SiGe, SiC, SiGeC, InAs, GaAs, InP or other like III/V compound semiconductors. Multilayers of these semiconductor materials can also be used as the semiconductor material of the handle substrate 10 and the topmost semiconductor layer 14. In one embodiment, the handle substrate 10 and the topmost semiconductor layer 14 are both comprised of silicon. In some embodiments, the handle substrate 10 is a non-semiconductor material including, for example, a dielectric material and/or a conductive material.

When the handle substrate 10 and the topmost semiconductor layer 14 of the SOI substrate comprise a semiconductor material, the handle substrate 10 and the topmost semiconductor layer 14 may have a same or different crystal orientation. For example, the crystal orientation of the handle substrate 10 and/or the topmost semiconductor layer 14 of the SOI substrate may be {100}, {110}, or {111}. Other crystallographic orientations besides those specifically mentioned can also be used in the present application. The handle substrate 10 and/or the topmost semiconductor layer 14 of the SOI substrate may be a single crystalline semiconductor material, a polycrystalline material, or an amorphous material. In some embodiments of the present application, at least the topmost semiconductor layer 14 of the SOI substrate is a single crystalline semiconductor material such as, for example, single crystal silicon. In some embodiments (not shown), the topmost semiconductor layer 14 can be processed to include semiconductor regions having different crystal orientations.

The buried insulator layer 12 of the SOI substrate may be a crystalline or non-crystalline oxide or nitride. In one embodiment, the buried insulator layer 12 is an oxide such as, for example, silicon oxide. The buried insulator layer 12 is continuously present between the handle substrate 10 and the topmost semiconductor layer 14 of the SOI substrate.

In one embodiment of the present application, the SOI substrate shown in FIG. 1 may be formed by a process referred to as SIMOX (separation by ion implantation of oxygen). In another embodiment, the SOI substrate shown in FIG. 1 may be formed by a layer transfer process in which two semiconductor wafers, one of which includes an oxide layer, are bonded together. In another embodiment, the SOI substrate may be formed by deposition of an insulator material and a semiconductor material on a handle substrate. In any of the processes mentioned above, an optional thinning step may used to thin the topmost semiconductor layer 14 of the SOI substrate to a desired and predetermined thickness value. The optional thinning step may include, for example, planarization or etching can be used to reduce the thickness of the semiconductor layer to a value within one of the ranges mentioned above.

In one embodiment of the present application, the thickness of the topmost semiconductor layer 14 of the SOI substrate is from 10 nm to 100 nm. Other thickness that are lesser than or greater than the aforementioned thickness range can also be used as the thickness of the topmost semiconductor layer 14 of the SOI substrate. In one embodiment of the present application, the buried insulator layer 12 of the SOI substrate has a thickness from 1 nm to 200 nm. Other thickness that are lesser than or greater than the aforementioned thickness range can also be used as the thickness of the buried insulator layer 12 of the SOI substrate. The thickness of the handle substrate 10 of the SOI substrate is inconsequential to the present application.

Figure 2:
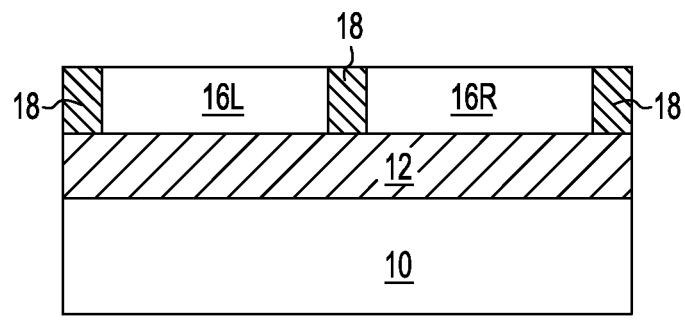
FIG. 2 is a pictorial representation (through a cross sectional view) illustrating the semiconductor-on-insulator substrate of FIG. 1 after forming at least one semiconductor material portion surrounded by an isolation structure within a topmost semiconductor layer of the semiconductor-on-insulator substrate.

Referring now to FIG. 2, there is illustrated the SOI substrate of FIG. 1 after forming at least one semiconductor material portion surrounded by an isolation structure 18 within the topmost semiconductor layer 14. In the drawings, two semiconductor material portions 16L, 16R are shown by way of an example. Since each semiconductor material portion 16L, 16R is formed within the topmost semiconductor layer 14 of the SOI substrate, each semiconductor material portion 16L, 16R comprises a same semiconductor material as that of the topmost semiconductor layer 14. In one example, each semiconductor material portion 16L, 16R may comprise single crystal silicon.

Each semiconductor material portion 16L, 16R that is formed has a bottommost surface that directly contacts an uppermost surface of the buried insulator layer 12. Moreover, each isolation structure 18 that is formed has a bottommost surface that directly contacts an uppermost surface of the buried insulator layer 12. Also, each semiconductor material portion 16L, 16R that is formed has an uppermost surface that is coplanar with an uppermost surface of each isolation structure 18 that is formed within the topmost semiconductor layer 14. Further, each semiconductor material portion 16L, 16R has vertical sidewall surfaces that directly contact vertical sidewall surfaces of an adjacent isolation structure 18. Each semiconductor material portion 16L, 16R that is formed can be used as a seed area for growing a base region of the compound semiconductor bipolar transistor of the present application.

The structure shown in FIG. 2 including the semiconductor material portions 16L, 16R and isolation structures 18 can be formed by first providing trenches within the topmost semiconductor layer 14 of the SOI substrate. The trenches can be formed by lithography and etching. Lithography includes applying a photoresist material on an exposed surface of the topmost semiconductor layer 14 of the SOI substrate, exposing the photoresist material to a desired pattern of radiation and then developing the photoresist utilizing a resist developer to provide a patterned photoresist atop the SOI substrate. Etching may include a dry etching process (e.g., reactive ion etching, ion beam etching, plasma etching or laser ablation) and/or a wet chemical etching process such as, for example, hydrofluoric acid dip. In some embodiments, a hard mask material such as, for example, an oxide, nitride and/or oxynitride, can be formed on an exposed surface of the topmost semiconductor layer 14 of the SOI substrate prior to forming the photoresist material. In such an embodiment, the pattern formed into the photoresist material is first transferred into the hard mask material, and then into the topmost semiconductor layer 14 of the SOI substrate. The patterned photoresist can be removed anytime after transferring the pattern from the patterned photoresist material into one of the underlying material layers by utilizing a conventional resist stripping process. In one example, the patterned photoresist can be removed after transferring the patterning into the underlying hard mask material. In another example, the patterned photoresist can remain atop the SOI substrate until after the pattern is transferred into the topmost semiconductor layer 14 of the SOI substrate.

Following the formation of the trenches within the topmost semiconductor layer 14, the trenches are then filled with a trench dielectric material such as, for example, an oxide. The trench fill may include a deposition process such as, for example, chemical vapor deposition or plasma enhanced chemical vapor deposition. Following the trench fill, an optional planarization process such as, for example, chemical mechanical polishing and/or grinding may be employed. When a hard mask material was formed atop the SOI substrate, the remaining hard mask material can be removed during the planarization process.

Figure 3:
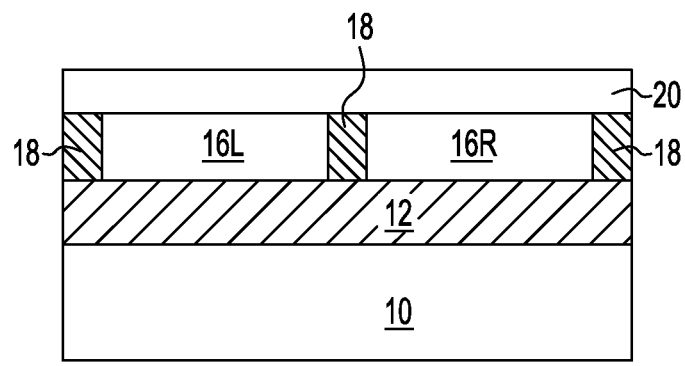
FIG. 3 is a pictorial representation (through a cross sectional view) illustrating the structure of FIG. 2 after forming a layer of polysilicon on an exposed surface of the topmost semiconductor layer of the semiconductor-on-insulator substrate.

Referring now to FIG. 3, there is illustrated the structure of FIG. 2 after forming a layer of polysilicon 20 on an exposed surface of each semiconductor material portion 16L, 16R and each isolation structure 18. The layer of polysilicon 20 can be formed by a deposition process including, but not limited to, chemical vapor deposition, plasma enhanced chemical vapor deposition, physical vapor deposition, evaporation, or chemical solution deposition. The layer of polysilicon 20 can have a thickness from 50 nm to 200 nm, although other thicknesses that are lesser than or greater than the aforementioned thickness range can also be employed for the layer of polysilicon 20.

Figure 4:
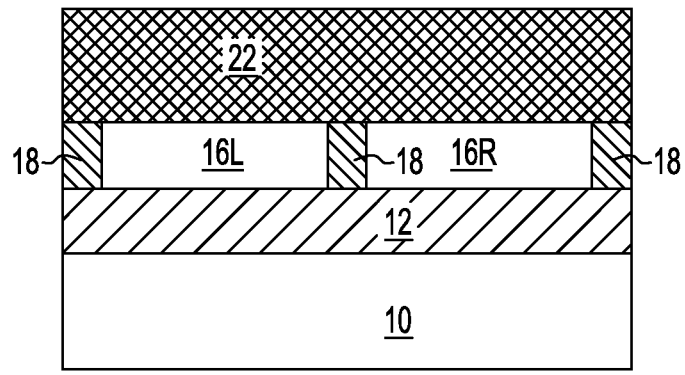
FIG. 4 is a pictorial representation (through a cross sectional view) illustrating the structure of FIG. 3 after converting the layer of polysilicon into a layer of oxide.

Referring now to FIG. 4, there is illustrated the structure of FIG. 3 after converting the layer of polysilicon 20 into a layer of oxide 22. In one embodiment of the present application, the layer of polysilicon 20 can be converted into the layer of oxide 22 by performing a thermal oxidation process or plasma oxidation. In some embodiments, the thermal oxidation process can include exposing the layer of polysilicon 20 to an oxygen-containing atmosphere at a temperature that is greater than room temperature. Examples of oxygen-containing atmospheres that can be used during the thermal oxidation process include, but are not limited to, molecular oxygen ($O_2$), air, steam, or a combination thereof. In one embodiment, the thermal oxidation process is performed at a temperature from 800° C. to 1200° C. In another embodiment, the plasma oxidation can be performed at a temperature from 150° C. to 500° C.

The layer of oxide 22 that is formed is a thermal oxide whose thickness is the same or greater than the thickness of the layer of polysilicon 20. In one embodiment of the present application, the layer of oxide 22 can have a thickness from 50 nm to 500 nm.

In some embodiments of the present application, the steps of forming the layer of polysilicon 20 and converting the layer of polysilicon 20 into a layer of oxide 22 can be omitted and replaced with a single step of forming a layer of oxide 22 on the exposed surfaces of the structure shown in FIG. 2. In such an embodiment, the layer of oxide 22 that can be formed directly on the exposed surfaces of the structure shown in FIG. 2 can be formed by a deposition process such as, for example, chemical vapor deposition or plasma enhanced chemical vapor deposition.

Figure 5:
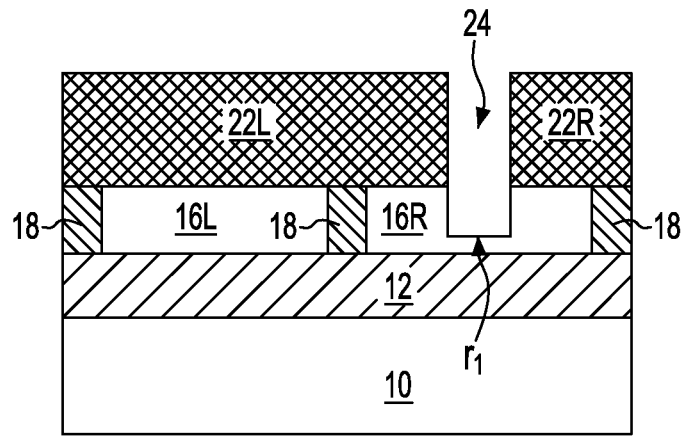
FIG. 5 is pictorial representation (through a cross sectional view) illustrating the structure of FIG. 4 after forming a trench through the layer of oxide and partially within at least one semiconductor material portion.

Referring now to FIG. 5, there is illustrated the structure of FIG. 4 after forming a trench 24 through the layer of oxide 22 and partially within at least one of the semiconductor material portions. In the drawings, a single trench that extends partially into the semiconductor material portion 16R is shown for illustration. Other trenches could also be formed that extend through to each other semiconductor material portion that is formed into the topmost semiconductor layer 14. The layer of oxide 22 that remains after forming the trench 24 into the structure can be referred to oxide layer portions 22L, 22R.

Each trench 24 that is formed is provided by lithography and etching as described above in forming the trenches used in providing the isolations structures 18. Each trench 24 that is formed has a width that is less than the width of the corresponding semiconductor material portion that it is formed into. In one embodiment, each trench 24 has a width from 10 nm to 500 nm. In another embodiment, each trench 24 has a width from 50 nm to 150 nm. Other widths are also possible so long as the width does not equal or extend beyond the width of the semiconductor material portion that the trench is formed into.

In one embodiment of the present application, each trench 24 that is formed provides a recessed semiconductor surface $r_1$ within the corresponding semiconductor material portion 16R that is vertically offset and located beneath the uppermost surface of the corresponding semiconductor material portion 16R. In one embodiment, each trench 24 that is formed provides a recessed semiconductor surface $r_1$ within the corresponding semiconductor material portion 16R that extends to a depth that is from 1 nm to 99 nm beneath the uppermost surface of the semiconductor material portion 16R.

Figure 6:
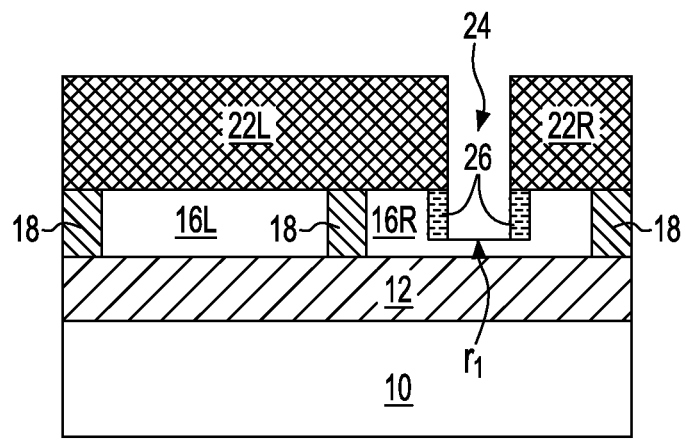
FIG. 6 is a pictorial representation (through a cross sectional view) illustrating the structure of FIG. 5 after selectively providing a dielectric spacer on exposed sidewalls of the semiconductor material portion within the trench.

Referring now to FIG. 6, there is illustrated the structure of FIG. 5 after selectively providing a dielectric spacer 26 on exposed sidewalls of the semiconductor material portion 16R within each trench 24. Each dielectric spacer 26 that is formed comprises a dielectric spacer material such as, for example, an oxide, a nitride and/or an oxynitride. In one embodiment, each dielectric spacer 26 is composed of silicon oxide. The dielectric spacers 26 can be formed by a thermal process such as, for example, a thermal oxidation and/or nitridation process. Following the thermal process, an etch such as, for example, reactive ion etching, can be used to remove portions of the dielectric spacer material that form along the recessed semiconductor surface $r_1$ of each semiconductor material portion that contains a trench partially formed therein.

Each dielectric spacer 26 that is formed has a sidewall surface that contacts an exposed sidewall surface of the semiconductor material portion 16R that contains trench 24. Each dielectric spacer 26 also includes another sidewall surface that can be vertically coincident to a vertical sidewall surface of the oxide layer portions 22L, 22R. Each dielectric spacer 26 can have a width, as measured from one sidewall surface of the dielectric spacer to the opposing sidewall surface of the dielectric spacer, of from 1 nm to 25 nm. Other widths for the dielectric spacers 26 are also possible so long as the dielectric spacers 26 that are present with the trench 24 remain spaced apart.

Figure 7:
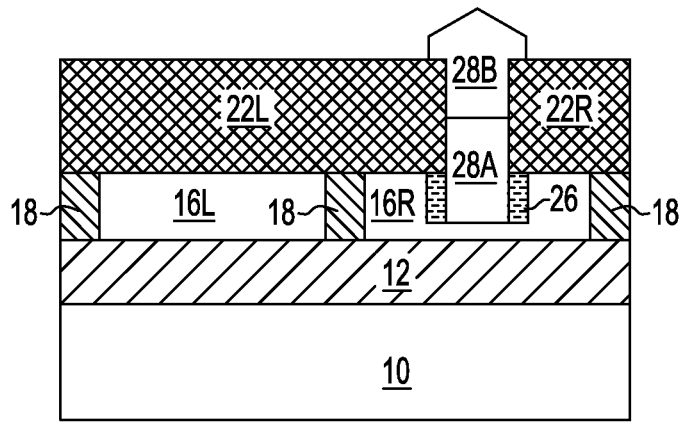
FIG. 7 is a pictorial representation (through a cross sectional view) illustrating the structure of FIG. 6 after growing a first compound semiconductor material comprising a bottommost compound semiconductor material portion of a first conductivity type and a first dopant concentration, and a topmost compound semiconductor material portion of the first conductivity type and a second dopant concentration, wherein the second dopant concentration is less than the first dopant concentration.

Referring now to FIG. 7, there is illustrated the structure of FIG. 6 after growing a first compound semiconductor material comprising a bottommost compound semiconductor material portion 28A of a first conductivity type and a first dopant concentration, and a topmost compound semiconductor material portion 28B of the first conductivity type and a second dopant concentration, wherein the second dopant concentration is less than the first dopant concentration, within each trench 24. In one embodiment, the first conductivity type is p-type. In another embodiment, the first conductive type is n-type.

The first compound semiconductor material provides a base region of the lateral bipolar transistor of the present application. Notably, the bottommost compound semiconductor material portion 28A provides an extrinsic base region of the lateral bipolar transistor of the present application, while the topmost compound semiconductor material portion 28B provides an intrinsic base region of the lateral bipolar transistor of the present application. As shown, the intrinsic base region (i.e., the topmost compound semiconductor material portion 28B) is located atop the extrinsic base region (i.e., the bottommost compound semiconductor material portion 28A). As also shown, the sidewall surfaces of the intrinsic base region (i.e., the topmost compound semiconductor material portion 28B) within trench 24 are vertically coincident with the sidewall surfaces of the extrinsic base region (i.e., the bottommost compound semiconductor material portion 28A) within trench 24.

The term "compound semiconductor" as used in connection with first compound semiconductor material denotes a semiconductor material that includes at least one element from Group III of the Periodic Table of Elements and at least one element from Group V of the Periodic Table of Elements, or a semiconductor material that includes at least one element from Group II of the Periodic Table of Elements and at least one element from Group VI of the Periodic Table of Elements. Typically, the compound semiconductors are binary, ternary or quaternary alloys including III/V elements or II/VI elements. Examples of III-V compound semiconductors that can be used in the present application as the first compound semiconductor material include, but are not limited to alloys of GaAs, InAs, InP, InGaAs, InAlAs, InAlAsSb, InAlAsP and InGaAsP. Examples of II/VI compound semiconductors that can be used in the present application as the first compound semiconductor material include, but are not limited to alloys of CdTe, CdS, CdSe, ZnTe, ZnS, ZnSe, $Hg_{1-x}Zn_xTe$ and $Cd_{1-x}Zn_xTe$. In one example, the first compound semiconductor material can be composed of GaAs, GaN or InGaAs.

In accordance with the present application, the bottommost compound semiconductor material portion 28A of the first compound semiconductor material and the topmost compound semiconductor material portion 28B of the first compound semiconductor are of unitary construction (i.e., they are composed of the same compound semiconductor material). Moreover, and since the first compound semiconductor material is formed by an epitaxial growth process, the first compound semiconductor material (including the bottommost compound semiconductor material portion 28A and the topmost compound semiconductor material portion 28B) has the same or nearly the same crystallographic orientation as that of the recessed semiconductor surface $r_1$ of the semiconductor material portion in which the first compound semiconductor material is formed on.

In one embodiment, the first dopant concentration of the bottommost compound semiconductor material portion 28A of the first compound semiconductor material can range from $1 \times 10^{17}$ atoms/cm$^3$ to $1 \times 10^{20}$ atoms/cm$^3$. In another embodiment, the first dopant concentration of the bottommost compound semiconductor material portion 28A of the first compound semiconductor material can range from $1 \times 10^{19}$ atoms/cm$^3$ to $1 \times 10^{20}$ atoms/cm$^3$.

In one embodiment, the second dopant concentration of the topmost compound semiconductor material portion 28B of the first compound semiconductor material can range from $1 \times 10^{15}$ atoms/cm$^3$ to $1 \times 10^{19}$ atoms/cm$^3$. In another embodiment, the second dopant concentration of the topmost compound semiconductor material portion 28B of the first compound semiconductor material can range from $1 \times 10^{18}$ atoms/cm$^3$ to $1 \times 10^{19}$ atoms/cm$^3$.

The bottommost compound semiconductor material portion 28A of the first compound semiconductor material has a higher amount of defects therein relative to the amount of defects that are present in the topmost compound semiconductor material portion 28B. In some embodiments, the topmost semiconductor material portion 28B is defect free. By "defect free" it is meant that the topmost semiconductor material portion 28B has a defect density on the order of less than $1 \times 10^8$ atoms/cm$^2$.

The first and/or second dopant concentrations of the first conductivity type within the bottommost and/or topmost compound semiconductor material portions 28A, 28B of the present application may be graded and/or uniform. By "uniform" it is meant that the dopant concentration of first conductivity type is the same throughout the entire thickness of the bottommost and/or topmost compound semiconductor material portions 28A, 28B. For example, the bottommost and/or topmost compound semiconductor material portions 28A, 28B having a uniform dopant concentration of the first conductivity type may have the same dopant concentration at the upper surface and bottom surface of the bottommost and/or topmost compound semiconductor material portions 28A, 28B, as well as the same dopant concentration at a central portion of the bottommost and/or topmost compound semiconductor material portions 28A, 28B between the upper surface and the bottom surface of the bottommost and/or topmost compound semiconductor material portions 28A, 28B. By "graded" it is meant that the dopant concentration of the first conductivity type varies throughout the thickness of the bottommost and/or topmost compound semiconductor material portions 28A, 28B. For example, the bottommost and/or topmost compound semiconductor material portions 28A, 28B having a graded dopant concentration may have an upper surface with a greater dopant concentration of the first conductivity type than the bottom surface of the bottommost and/or topmost compound semiconductor material portions 28A, 28B, and vice versa.

As stated above, the first compound semiconductor material including the bottommost and topmost compound semiconductor material portions 28A, 28B is formed by an epitaxial growth process. The term "epitaxial growth and/or deposition" means the growth of a semiconductor material on a deposition surface of a semiconductor material, in which the semiconductor material being grown has the same (or nearly the same) crystalline characteristics as the semiconductor material of the deposition surface. In accordance with an embodiment of the present application, the first compound semiconductor material including the bottommost and topmost compound semiconductor material portions 28A, 28B can be epitaxially grown at a temperature from 300° C. to 1000° C. In one example, the first compound semiconductor material including the bottommost and topmost compound semiconductor material portions 28A, 28B can be epitaxially grown at a temperature from 600° C. to 800° C. In one embodiment of the present application, the first compound semiconductor material including the bottommost and topmost compound semiconductor material portions 28A, 28B can be epitaxially grown utilizing low pressure chemical vapor deposition (LPCVD).

The epitaxial growth process includes a first epitaxial growth step of providing the bottommost compound semiconductor material portion 28A of the first compound semiconductor material and a second epitaxial growth step of providing the topmost compound semiconductor material portion 28B. The first epitaxial growth step includes epitaxially growing the bottommost compound semiconductor material portion 28A using a gas mixture that includes at least one compound semiconductor material precursor source and a dopant (n or p-type). Such an epitaxial growth process can be referred to herein as an in-situ doped epitaxial growth process. With or without breaking vacuum, the topmost compound semiconductor material portion 28B can be epitaxially grown atop the bottommost semiconductor material portion 28A utilizing the same at least one compound semiconductor material source. The first conductivity type dopant (n- or p-type) at the second dopant concentration can be introduced during the epitaxial growth of the topmost semiconductor material portion 28B, or following the epitaxial growth of an intrinsic topmost semiconductor material portion by one of ion implantation or gas phase doping.

In embodiments in which the first compound semiconductor material includes at least one element from Group III of the Periodic Table of Elements and at least one element from Group V of the Periodic Table of Elements, the n-type dopants that can be used in providing the bottommost and topmost compound semiconductor material portions 28A, 28B can include, but are not limited to, silicon, germanium, sulfur, or tellurium. In embodiments in which the first compound semiconductor material includes at least one element from Group III of the Periodic Table of Elements and at least one element from Group V of the Periodic Table of Elements, the p-type dopants that can be used in providing the bottommost and topmost compound semiconductor material portions 28A, 28B can include, but are not limited to, zinc, beryllium, or carbon.

In embodiments in which the first compound semiconductor material includes at least one element from Group II of the Periodic Table of Elements and at least one element from Group VI of the Periodic Table of Elements, the n-type dopants that can be used in providing the bottommost and topmost compound semiconductor material portions 28A, 28B can include, but are not limited to, chlorine. In embodiments in which the first compound semiconductor material includes at least one element from Group II of the Periodic Table of Elements and at least one element from Group VI of the Periodic Table of Elements, the p-type dopants that can be used in providing the bottommost and topmost compound semiconductor material portions 28A, 28B can include, but are not limited to, nitrogen.

The bottommost compound semiconductor material portion 28A of first compound semiconductor material has a first thickness and the topmost compound semiconductor material portion 28B has a second thickness that is the same or greater than the first thickness.

Figure 8:
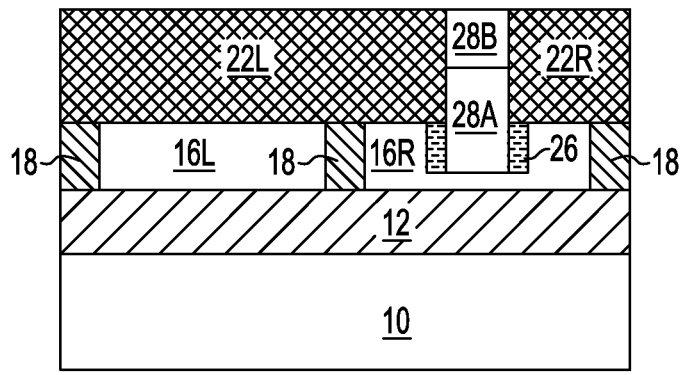
FIG. 8 is a pictorial representation (through a cross sectional view) illustrating the structure of FIG. 7 after performing a planarization process.

Referring now to FIG. 8, there is illustrated the structure of FIG. 7 after performing a planarization process which provides a planar structure in which an uppermost surface of the topmost compound semiconductor material portion 28B is coplanar with an uppermost surface of the oxide layer portions 22L, 22R. The planarization process removes any excess topmost compound semiconductor material portion 28B that is present on the uppermost surface of each oxide layer portion 22L, 22R. In one embodiment of the present application, the planarization process is performed utilizing a chemical mechanical polishing process. In another embodiment, an etch back process can be used to provide the planar structure shown in FIG. 8.

Figure 9:
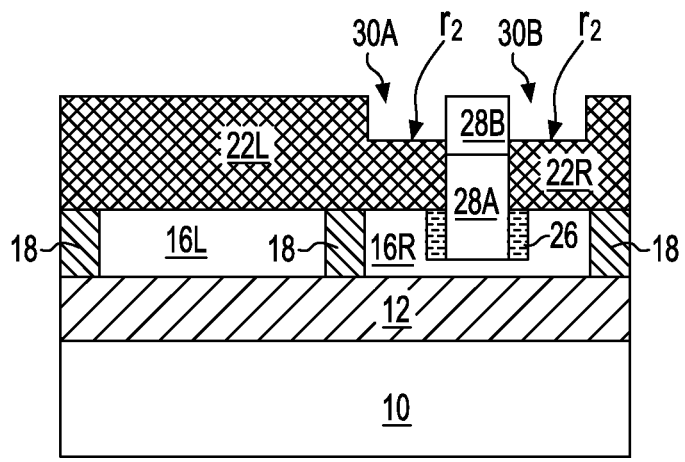
FIG. 9 is a pictorial representation (through a cross sectional view) illustrating the structure of FIG. 8 after providing a first recessed opening located on one side of the first compound semiconductor material and within a remaining portion of the layer of oxide, and forming a second recessed opening located on another side of the first compound semiconductor material and within another remaining portion of the layer of oxide.

Referring now to FIG. 9, there is illustrated the structure of FIG. 8 after providing a first recessed opening located 30A on one side of the first compound semiconductor material and within one of the remaining oxide layer portions 22L, and forming a second recessed opening 30B located on another side of the first compound semiconductor material and within the other remaining oxide layer portion 22R. The first and second recessed openings 30A, 30B, which are provided simultaneously, can be formed by lithography and etching. In one embodiment, a reactive ion etch can be used to formed each recessed opening. In another embodiment, a chemical wet etch utilizing hydrofluoric acid as a chemical etchant can be employed.

As shown, each of the first and second recessed openings 30A, 30B exposes a sidewall surface of the topmost compound semiconductor material portion 28B. As is also shown, each recessed first and second recessed opening 30A, 30B exposes a recessed oxide surface $r_2$ within the corresponding oxide layer portion 22L, 22R. Each recessed oxide surface $r_2$ is vertically offset and located beneath the remaining uppermost surface of each oxide layer portion 22L, 22R. In one embodiment, each recessed first and second recessed opening 30A, 30B extends to a depth from 5 nm to 100 nm below the remaining uppermost surface of each oxide layer portion 22L, 22R. Other depths are possible so long as the depth of each first and second recessed openings 30A, 30B does not remove oxide from sidewall surfaces of the bottommost compound semiconductor material portion 28A.

Figure 10:
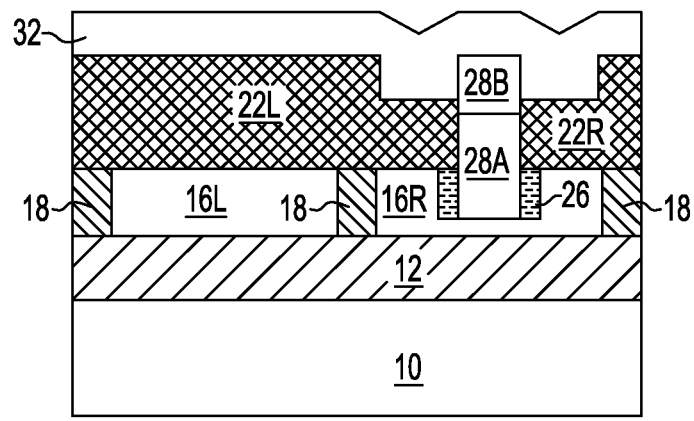
FIG. 10 is a pictorial representation (through a cross sectional view) illustrating the structure of FIG. 9 after forming a second compound semiconductor material of a second conductivity type that is opposite from the first conductivity type within the first and second recessed openings, on exposed surfaces of the remaining layer of oxide, and atop the first compound semiconductor material.

Referring now to FIG. 10, there is illustrated the structure of FIG. 9 after forming a second compound semiconductor material 32 of a second conductivity type that is opposite from the first conductivity type within the first and second recessed openings 30A, 30B, on exposed surfaces of the remaining layer of oxide (i.e., the oxide layer portions 22L, 22R), and atop the compound semiconductor material portion 28B of the first compound semiconductor material.

In one embodiment and when the first conductivity type is p-type, the second conductivity is n-type. In another embodiment and when the first conductivity type is n-type, the second conductivity type is p-type.

The second compound semiconductor material 32 includes one of the compound semiconductor materials mentioned above for the first compound semiconductor material. In one embodiment, the second compound semiconductor material 32 comprises a same compound semiconductor material as that of the first compound semiconductor material. In another embodiment, the second compound semiconductor material 32 comprises a different compound semiconductor material than the first compound semiconductor material. In such an embodiment, the second compound semiconductor material can be comprised of a compound semiconductor material that has a wider band gap than the compound semiconductor material used in providing the first compound semiconductor material.

For example, when the first compound semiconductor material is comprised of GaAs, InGaP, AlGaAs or InAlP can be used as wide band gap material for providing the second compound semiconductor material 32. In another example, when the first compound semiconductor material is comprised of InGaAs, InAlAs can be used as the wide band gap material for providing the second compound semiconductor material. In yet another example, and when GaN is employed in providing the first compound semiconductor material, AlGaN can be used in providing the second compound semiconductor material 32.

The second compound semiconductor material 32 can be provided utilizing an epitaxial growth process such as described above in forming the first compound semiconductor material. The dopant that provides the second conductivity type to the second compound semiconductor material 32 can be introduced during the epitaxial growth process or after epitaxial growth by one of ion implantation or gas phase doping.

In one embodiment of the present application, the concentration of dopant that is present in the second compound semiconductor material 32 can range from $1\times10^{17}$ atoms/cm$^3$ to $1\times10^{20}$ atoms/cm$^3$. In one embodiment of the present application, the concentration of dopant that is present in the second compound semiconductor material 32 can range from $1\times10^{19}$ atoms/cm$^3$ to $1\times10^{20}$ atoms/cm$^3$.

In one embodiment of the present application, the second compound semiconductor material 32 can be single crystalline. In another embodiment of the present application, the second semiconductor material 32 can be polycrystalline.

Figure 11:
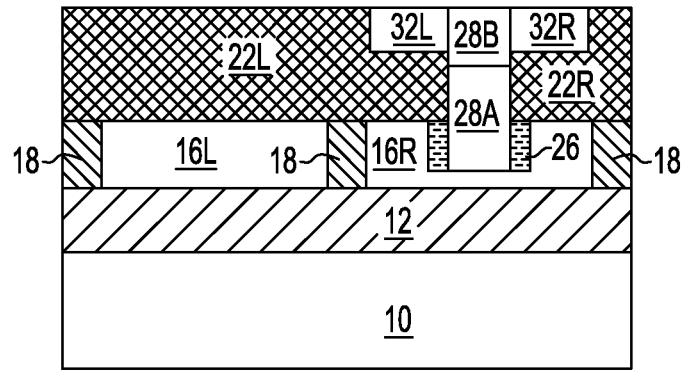
FIG. 11 is a pictorial representation (through a cross sectional view) illustrating the structure of FIG. 10 after performing a planarization process to remove any portion of the second compound semiconductor material that is present outside of the first and second recessed openings.

Referring now to FIG. 11, there is shown the structure of FIG. 10 after performing a planarization process to remove any portion of the second compound semiconductor material 32 that is present outside of the first and second recessed openings 30A, 30B. That is, the planarization process removes any portion of the second compound semiconductor material 32 that is present on the uppermost surface of the remaining oxide layer portions 22L, 22R and the uppermost surface of the topmost compound semiconductor material portion 28B. In one embodiment, the planarization process may be performed by chemical mechanical polishing. In another embodiment, the planarization process may comprise an etch back process.

Notwithstanding the type of planarization process employed, the planarization process forms a planar structure in which the remaining second compound material portions 32L, 32R have uppermost surfaces that are coplanar with the uppermost surfaces of the remaining oxide layer portions 22L, 22R and the topmost compound semiconductor material portion 28B.

As is shown, each remaining second compound material portions 32L, 32R has a sidewall surface that directly contacts a sidewall surface of the topmost compound semiconductor material portion 28B. The direct contact between the sidewalls of each remaining second compound semiconductor material portion 32L, 32R and the sidewalls of the topmost compound semiconductor material portion 28B from the junction interfaces between the emitter-base and the collector-base. As is also shown, each second compound material portion 32L, 32R has a bottommost surface that directly contacts the recessed oxide surface $r_2$ within the corresponding oxide layer portion 22L, 22R.

One of the remaining second compound material portions 32L or 32R can form the emitter region of the lateral bipolar transistor of the present application, while the other remaining second compound material portion 32L or 32R forms the collector region of the lateral bipolar transistor of the present application. The lateral bipolar transistor of the present application has symmetrical emitter-base and collector-base junctions. By "symmetrical" it is meant both the emitter and collector consist of the same semiconductor material with the same doping level.

Figure 12:
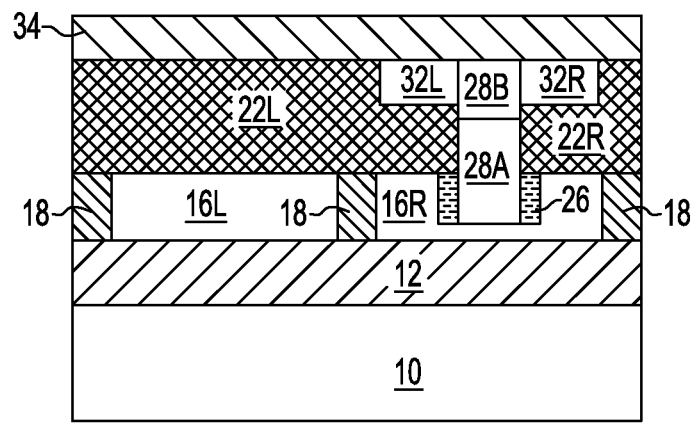
FIG. 12 is a pictorial representation (through a cross sectional view) illustrating the structure of FIG. 11 after forming a layer of insulator.

Referring now to FIG. 12, there is shown the structure of FIG. 11 after forming a layer of insulator 34 atop the exposed surfaces of each remaining oxide layer portion 22L, 22R, each second compound material portion 32L, 32R and the topmost compound semiconductor material portion 28B.

The layer of insulator 34 may comprise any dielectric material including an oxide, nitride, and/or oxynitride. In one embodiment of the present application, the layer of insulator 34 may comprise a same dielectric material as that of the remaining oxide portions 22L, 22R. In another embodiment of the present application, the layer of insulator 34 may comprise a different dielectric material as that of the remaining oxide portions 22L, 22R. The layer of insulator 34 can be formed by a deposition process including, but not limited to, chemical vapor deposition, plasma chemical vapor deposition, evaporation, chemical solution deposition, or physical vapor deposition. The layer of insulator 34 can have a thickness that is from 10 nm to 300 nm. Other thicknesses that are lesser than or greater than the aforementioned thickness range can also be employed for the layer of insulator 34.

Figure 13A:
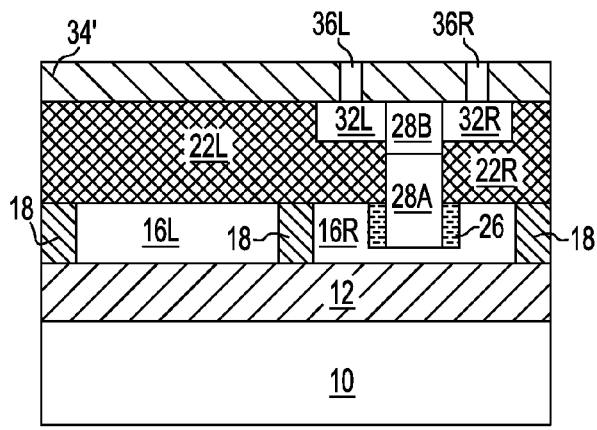
FIG. 13A is a pictorial representation (through a cross sectional view) illustrating the structure of FIG. 12 after forming a first contact opening through a first portion of the layer of insulator and contacting a topmost surface of the second compound semiconductor material within the first recessed opening, and forming a second contact opening through a second portion of the layer of insulator and contacting a topmost surface of the second compound semiconductor material within the second recessed opening, and forming a contact material within each of the first and second openings.

Referring now FIG. 13A, there is illustrated the structure of FIG. 12 after forming a first contact opening through a first portion of the layer of insulator 34 and contacting a topmost surface of the second compound semiconductor material portion within the first recessed opening, and forming a second contact opening through a second portion of the layer of insulator 34 and contacting a topmost surface of the second compound semiconductor material within the second recessed opening, and forming a contact material 36L, 36R within each of the first and second openings. The remaining portions of the layer of insulator are labeled as 34' in the drawings.

Figure 13B:
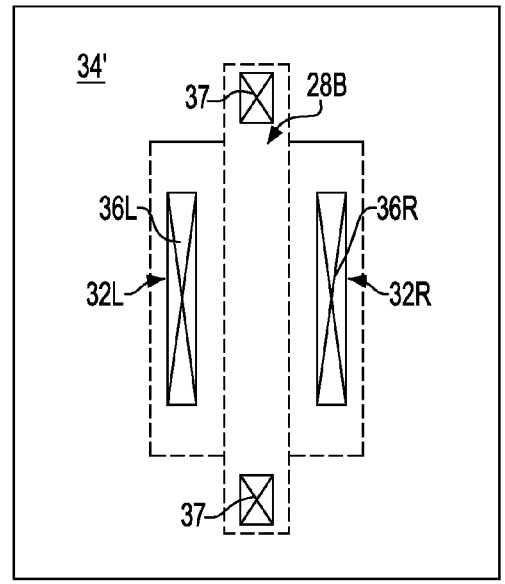
FIG. 13B is a top-down view of the structure shown in FIG. 13A.

The first and second contact openings can be formed by lithography and etching. Following the etching, a contact material such as for example W, Al, Cu or alloys thereof, can be deposited and an optional planarization process can follow the deposition of the contact material. The contact material formed into each contact opening can be the same or different. Contacts (not shown in FIG. 13A) can be formed to the base region by lithography and etching, followed by deposition and optional planarization of a contact material. FIG. 13B illustrates the positioning of contact materials 37 to the base region relative to the contact materials 36L, 36R to the emitter and collector regions. In some embodiments, the semiconductor material portion 16R can be heavily doped the same type as that of the base region so that it can be used as a contact to the extrinsic base region. By "heavily doped" it is meant a dopant concentration from $1\times10^{17}$ atoms/cm$^3$ or greater.

Specifically, FIGS. 13A and 13B illustrate a lateral bipolar transistor on an SOI substrate in accordance with an embodiment of the present application. The lateral bipolar transistor of the present application includes at least one semiconductor material portion 16R located on a surface of a buried insulator layer 12; the at least one semiconductor material portion is laterally surrounded by an isolation structure 18 which is also present on the surface of the buried insulator layer 12. The structure further includes a base region (28A, 28B) extending upward from a recessed semiconductor surface $r_1$ of the at least one semiconductor material portion 16R, wherein the base region comprises a vertical stack of, from bottom to top, an extrinsic base region and an intrinsic base region. The extrinsic base region comprises a first compound semiconductor material portion 28A of a first conductivity type and a first dopant concentration and the intrinsic base region comprises another first compound semiconductor material portion 28B of the first conductivity type and a second dopant concentration, wherein the second dopant concentration is less than the first dopant concentration. The structure even further includes a collector region 32L or 32R comprising a second compound semiconductor material portion of a second conductivity type which is opposite of the first conductivity type located on one side on the base region (28A, 28B) and in direct contact with a sidewall surface of the intrinsic base region 28B. The structure yet further includes an emitter region (the other of 32L or 32R) comprising another second compound semiconductor material portion of the second conductivity type which is opposite of the first conductivity type located on another side on the base region (28A, 28B) and in direct contact with another sidewall surface of the intrinsic base region (28B).

As is shown, the collector and emitter regions each have an uppermost surface that is coplanar with the intrinsic base region 28B of the base region. As is also shown, the collector and emitter regions each have a bottommost surface that is coplanar with each other and vertically offset and located above a bottommost surface of the intrinsic base region 28B. As is further shown, the emitter region, collector region and the base region are in the shape of a T.

An insulator layer 34' is located above the collector region, emitter region and base region, and contact materials 36L, 36R and 37 can be located within the insulator layer 34'.

Figure 14:
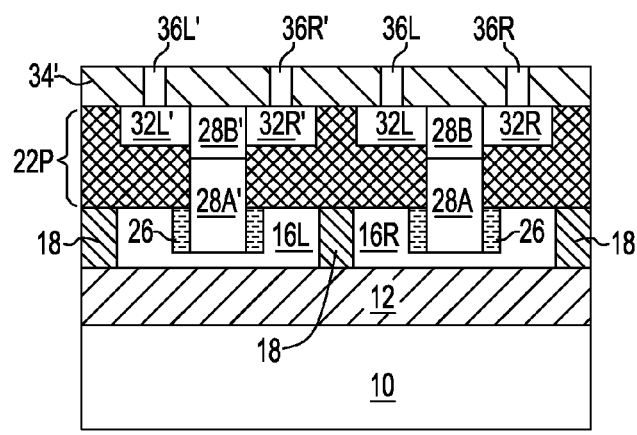
FIG. 14 is a pictorial representation (through a cross sectional view) illustrating another structure that can be formed in the present application in which two symmetrical lateral heterojunction bipolar transistors each containing a T-shaped emitter, base and collector region are formed on an SOI substrate.

Referring now to FIG. 14, there is illustrated another structure that can be formed in the present application in which two symmetrical lateral heterojunction bipolar transistors each containing a T-shaped emitter, base and collector region are formed on an SOI substrate. The structure shown in FIG. 14 is similar to the one shown in FIG. 13 except that semiconductor material portion 16L was processed to include another T-shaped emitter, base and collector region. Specifically, the structure shown in FIG. 14 include the elements shown in FIG. 13 plus at least one other semiconductor material portion material 16L laterally spaced apart from semiconductor material portion 16R by an isolation structure 18, wherein the at least one other semiconductor material portion 16L is located on the surface of the buried insulator layer 12. The at least one other semiconductor material portion 16L contains another base region (28A', 28B') extending upward from a recessed semiconductor surface of the at least one other semiconductor material portion 16L, wherein the another base region (28A', 28B') comprises a vertical stack of, from bottom to top, another extrinsic base region 28A' and another intrinsic base region 28B'. The another extrinsic base region 28A' comprises a third compound semiconductor material portion of a third conductivity type and a third dopant concentration and the another intrinsic base region 28B' comprises another third compound semiconductor material portion of the third conductivity type and a fourth dopant concentration, wherein the fourth dopant concentration is less than the third dopant concentration. The third semiconductor compound material can include one of the compound semiconductor materials mentioned above for the first compound semiconductor material. The third conductivity type can be n-type or p-type. In some embodiments, the third conductivity type can be the same as that of the first conductivity type. In other embodiments, the third conductivity type can be different (i.e., opposite) from the first conductivity type. The third dopant concentration can be within the range mentioned above for the first dopant concentration, while the fourth dopant concentration can be in the range mentioned above for the second dopant concentration.

Another collector region (32L' or 32R') comprising a fourth compound semiconductor material portion of a fourth conductivity type which is opposite of the third conductivity type is located on one side on the another base region (28A', 28B') and in direct contact with a sidewall surface of the another intrinsic base region 28B'. Another emitter region (the other of 32L' or 32R') comprising another fourth compound semiconductor material portion of the fourth conductivity type which is opposite of the third conductivity type is located on another side on the another base region (28A', 28B') and in direct contact with another sidewall surface of said another intrinsic base region 28B'. The fourth compound semiconductor material portions can include one of the compound semiconductor materials mentioned above for the second compound semiconductor material. In one embodiment, the fourth compound semiconductor material portions comprise a compound semiconductor material that has a wider band gap than the compound semiconductor material used in providing the another base region 28A', 28B'. In one embodiment, the fourth conductivity type can be the same as that of the second conductivity type. In yet another embodiment, the fourth conductivity type can be different from the second conductivity type. The concentration of dopant within the another collector region and the another emitter region can be within the range mentioned above for the dopant present in the second compound semiconductor material.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A method of forming a semiconductor structure comprising:
providing a structure including at least one semiconductor material portion laterally surrounded by an isolation structure and located on a surface of a buried insulator layer, wherein a layer of oxide is located on exposed surface of each of said at least one semiconductor material portion and said isolation structure;
forming a trench through said layer of oxide and partially into said at least one semiconductor material portion, wherein said trench provides a recessed semiconductor surface within said at least one semiconductor material portion;
forming a dielectric spacer on exposed sidewall surfaces of said at least one semiconductor material portion within said trench;
epitaxially growing a first semiconductor compound material from said recessed semiconductor surface, said first semiconductor compound material comprises a bottommost compound semiconductor material portion of a first conductivity type and a first dopant concentration, and a topmost compound semiconductor material portion of the first conductivity type and a second dopant concentration, wherein the second dopant concentration is less than the first dopant concentration;
forming a first recessed opening in said layer of oxide to expose one sidewall surface of said topmost compound semiconductor material portion and forming a second recessed opening in said layer of oxide to expose another sidewall surface of said topmost compound semiconductor material portion;
forming a second compound semiconductor material portion of a second conductivity type that is opposite from the first conductivity type within each of the first and second recessed openings; and
forming an insulator layer atop exposed surfaces of each of said second compound semiconductor material portions and the topmost semiconductor material portion.

2. The method of claim 1, wherein said layer of oxide is formed by depositing a layer of polysilicon and then converting said layer of polysilicon by thermal oxidation into said layer of oxide.

3. The method of claim 1, further comprising providing a first and second contact material within portions of said insulator layer.

4. The method of claim 3, wherein said first contact material contacts an uppermost surface of one of the second compound semiconductor material portions, and said second contact material contacts an uppermost surface of the other second compound semiconductor material portion.

5. The method of claim 1, wherein said dielectric spacer is formed by a thermal process and etching.

6. The method of claim 1, wherein said first conductivity type is p-type and said second conductivity type is n-type.

7. The method of claim 1, wherein said first conductivity type is n-type and said second conductivity type is p-type.

8. The method of claim 1, wherein each second compound semiconductor material portion comprises a same second compound semiconductor material.

9. The method of claim 8, wherein said second semiconductor compound material has a wider band gap than said first semiconductor compound material.

* * * * *